United States Patent [19]
Nelson et al.

[11] Patent Number: 6,098,095
[45] Date of Patent: Aug. 1, 2000

[54] INSTRUMENT COMMUNICATION THROUGH SIGNAL JACKS

[75] Inventors: Theodore G. Nelson, Portland; James R. Brooks, Beaverton; Warren Woo, Portland, all of Oreg.

[73] Assignee: Tektronix, Inc., Beaverton, Oreg.

[21] Appl. No.: 09/031,091

[22] Filed: Feb. 26, 1998

[51] Int. Cl.[7] .................................................. G06F 13/36
[52] U.S. Cl. .................... 709/208; 709/209; 709/210; 714/25
[58] Field of Search .................................. 709/208, 209, 709/210; 714/25, 30; 702/57

[56] References Cited

U.S. PATENT DOCUMENTS

| | | | |
|---|---|---|---|
| 5,508,621 | 4/1996 | Wong | 324/549 |
| 5,511,108 | 4/1996 | Severt et al. | 379/21 |
| 5,526,287 | 6/1996 | French | 702/104 |
| 5,539,298 | 7/1996 | Parkins et al. | 320/139 |
| 5,544,073 | 8/1996 | Piety et al. | 364/528.14 |
| 5,631,570 | 5/1997 | King | 324/718 |
| 5,696,777 | 12/1997 | Hofsaess | 714/820 |
| 5,811,979 | 9/1998 | Rhein | 324/718 |

*Primary Examiner*—Zarni Muang
*Assistant Examiner*—Abdullahi E. Salad
*Attorney, Agent, or Firm*—Boulden G. Griffith; Thomas F. Lenihan

[57] ABSTRACT

A method by which a microprocessor based handheld multimeter, or other handheld electronic instrument, can communicate with a computer or other microprocessor based device through the measurement input jacks of the handheld multimeter. A handheld meter, thus equipped, can receive control or calibration data from, and provide test or calibration data to, a host computer or microprocessor based accessory or other instrument. To enable this capability, the handheld meter employs dual-signal, single-axis jacks, for example split banana jacks, for one or more of its signal and ground receptacles. The handheld meter and the computer, or another microprocessor based instrument or accessory device that the meter is to communicate with, are equipped with mutually compatible software and appropriate hardware to support single signal path communication.

10 Claims, 2 Drawing Sheets

INSTRUMENT COMMUNICATION THROUGH SIGNAL JACKS

FIELD OF THE INVENTION

This invention relates to communication with and by an instrument through connector receptacles normally used for carrying input signals to be measured, and more particularly to such communication between a handheld multimeter containing a microprocessor and an external computer or microprocessor based instrument or accessory.

CROSS-REFERENCE TO RELATED APPLICATIONS

[not applicable]

STATEMENT REGARDING FEDERALLY SPONSORED RESEARCH AND DEVELOPMENT

[not applicable]

BACKGROUND OF THE INVENTION

Multimeters are multi-function electronic instruments that typically measure such electrical parameters as dc voltage, ac voltage, current, and resistance, sometimes other physical quantities such as temperature. Most multimeters are designed to be handheld, and therefore are usually light weigh, battery powered, designed to be safe without the benefit of an earth ground connection.

Many multimeters employ "banana"-type connectors and receptacles for test lead attachment. When two banana plugs and the receptacles that are to receive them are mechanically paired and placed a standard distance apart, connection to pairs of appropriate input jacks is made quick and easy, even for an operator who is using only one hand.

In recent years, there has been some movement toward the use of connectors that make two independent electrical connections through a jack and plug that share a single central axis. Each such connector has two conductive contact areas that are electrically isolated from each other. "Old telephone" and "split banana" connectors both have this property. Split banana connectors, which are the most common in digital multimeters, are currently available in at least two versions. One version has two circumferential radially symmetrical connective regions at different distances along a central axis, with those conductive regions electrically isolated from each other by a radial band of insulative material. The other version has bilateral symmetry, with a longitudinal insulator separating two longitudinal conductive regions. Both types of these connectors are described and illustrated in U.S. Pat. No. 5,508,621 to Wong for a "Four-Terminal Ohmmeter Apparatus", hereby incorporated by reference.

To differentiate them from coaxial cables and other such connectors that have two conductive parts but wherein one of those conductive parts is dedicated to being exclusively used as a ground reference and electrical and/or mechanical shielding, we will hereinafter refer to this class of connectors as "dual-signal, single-axis" connectors.

One of the desirable features of these dual-signal, single-axis connectors is that they can mate and work effectively with their single-signal, single-axis counterparts, and thereby provide "backward compatibility". Moreover, when used with their single-signal counterparts, these dual-signal connectors have their separate conductive regions brought into electrical contact with each other by the conductive part of their single-signal counterpart. In some applications, this can be taken advantage of by detecting when the two parts that are normally insulated from each other become shorted together. That information can be monitored and provide an indication that a particular jack is in use. Along with other information known to the instrument's software, that particular piece of information might be informative of how the instrument is presently being used and therefore which functions or safety features should be made active.

While some larger multimeters and small bench top instruments have communication ports that allow them to be controlled by a computer over a general purpose interface bus (GPIB) or other similar type of communication bus, most handheld multimeters do not provide facilities for computer communication, or provide for such communication via a dedicated multi-pin port, such as a RS-232, GBIP, PS/2, or some other serial or parallel port. There are serious safety concerns with any wire-connected communication ports, however. Because handheld instruments may be connected to input voltages as large as 1,000 V, to be safe, communication ports require electrical isolation, for example, by optical coupling. An optical coupling system adds to size, weight, and expense. Since these factors are all at a premium in handheld instruments, such instruments have usually been designed to forego having a multi-pin communication port for calibration or control by a computer. Nonetheless, having a facility for communication with a computer is highly desirable, both for communication of calibration data and for communication of operational control signals and measurement results data.

BRIEF SUMMARY OF THE INVENTION

The present invention provides a method by which a microprocessor based handheld multi-meter, or other handheld electronic instrument, can communicate with a computer or other microprocessor based device through the measurement input jacks of the handheld multi-meter. A handheld meter, thus equiped, can receive control or calibration data from, and provide test or calibration data to, a host computer or microprocessor based accessory or other instrument. To enable this capability, the handheld meter employs dual-signal, single-axis jacks, for example split banana jacks, for one or more of its signal and ground receptacles. The handheld meter and the computer, or another microprocessor based instrument or accessory device that the meter is to communicate with, are equipped with mutually compatible software and appropriate hardware to support single signal path communication.

DETAILED DESCRIPTION OF THE INVENTION

Figure 1:
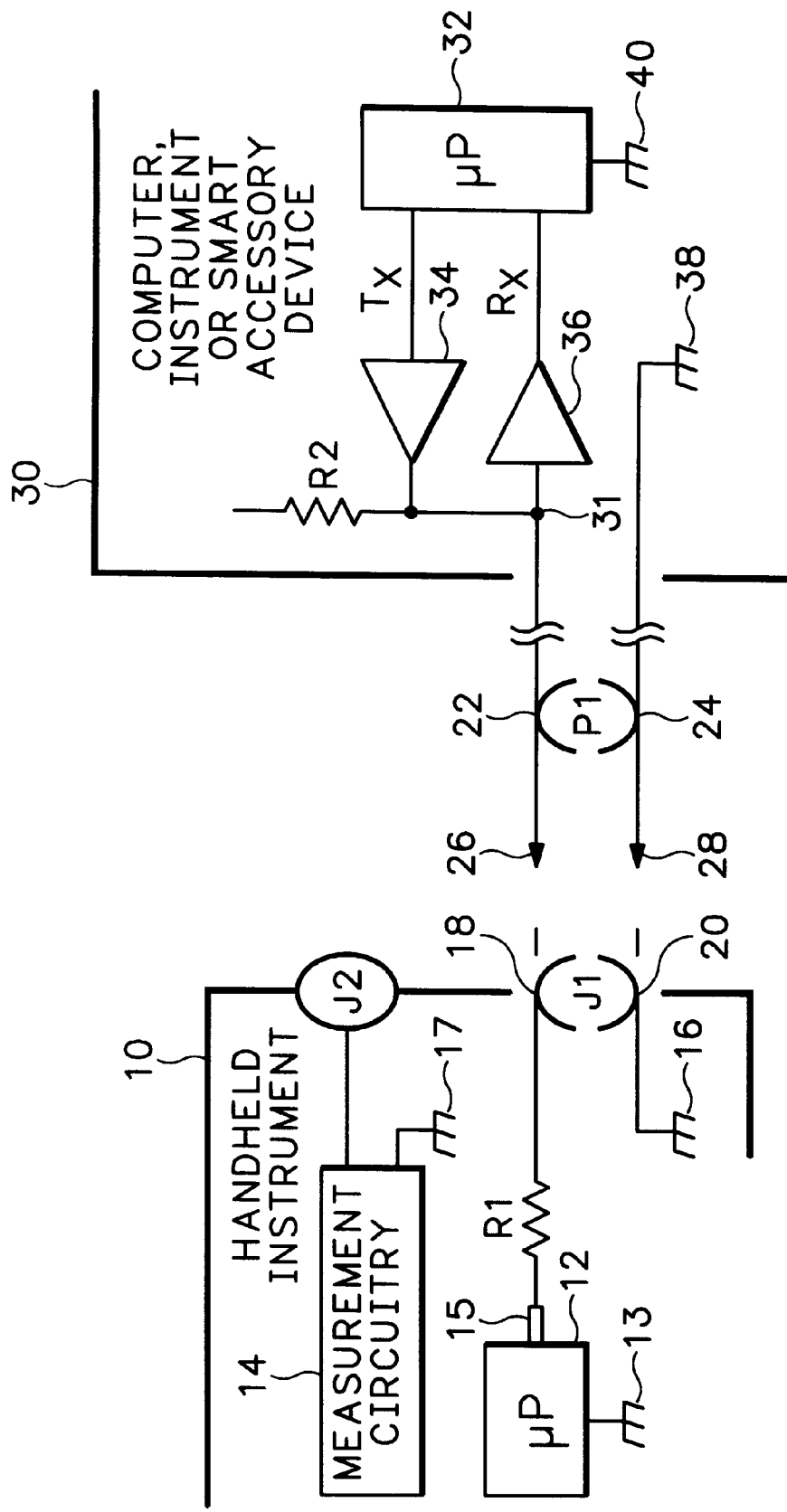
FIG. 1 shows in schematic form how the communication method of the present invention may be implemented through the ground return jack of a handheld instrument.
Figure 2:
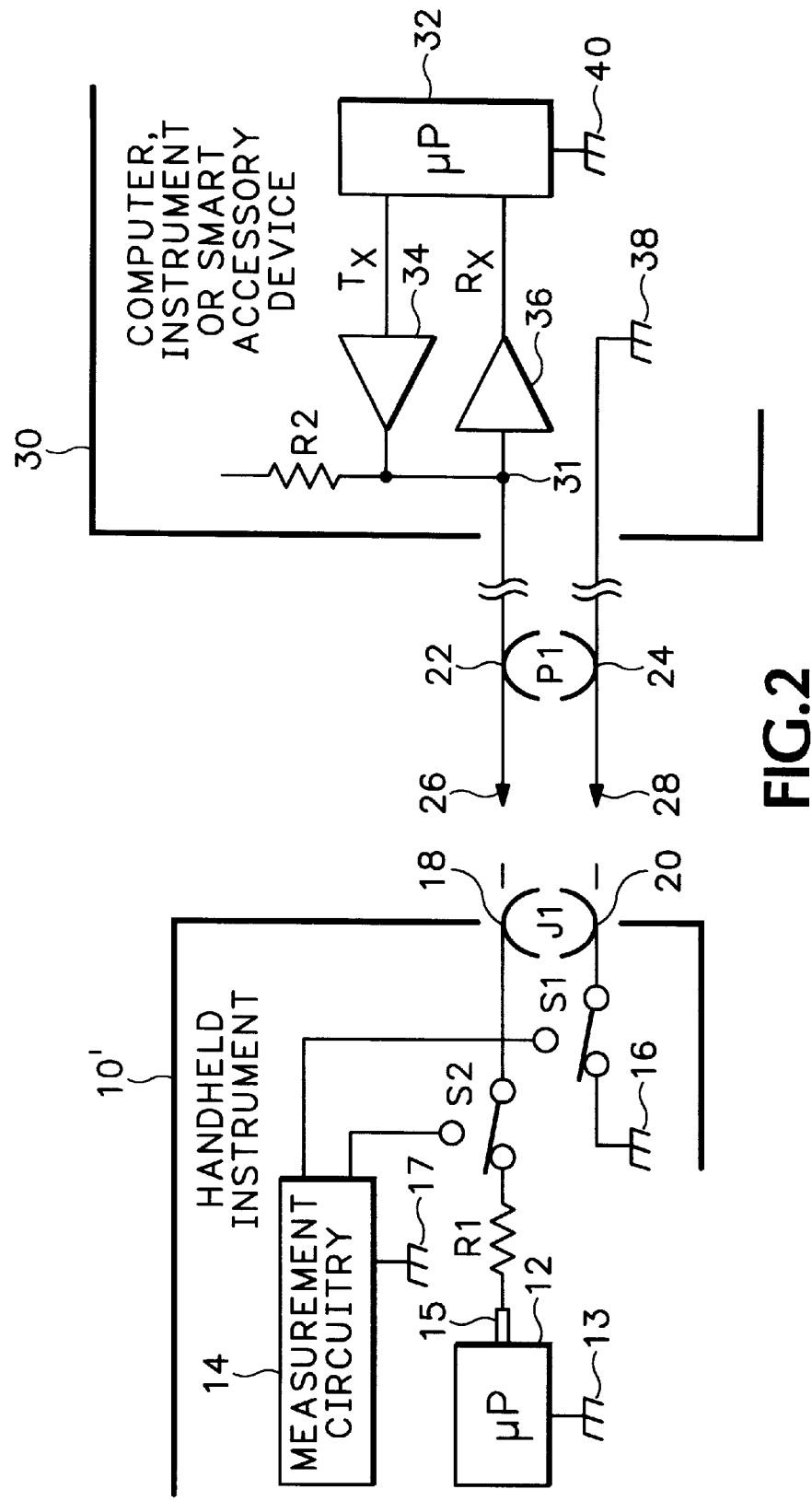
FIG. 2 shows in schematic form how the communication method of the present invention may be implemented through a signal measurement jack of a handheld instrument.

FIG. 1 shows a microprocessor based handheld instrument and a computer or some other microprocessor based device configured to support the method of the present invention. In this preferred embodiment, the dual-signal, single-axis jack of the handheld instrument that is used in the communication mode is the ground return jack normally used in making measurements. In the case of FIG. 2, the dual-signal, single-axis jack of the handheld instrument used for the purpose of the communication according to this invention is a measurement signal jack, such as one of the jacks normally used for measurement of AC or DC voltage, current, frequency, resistance, or temperature. Electrical design and safety considerations make this a less preferable implementation.

Referring first to FIG. 1, handheld instrument 10 contains a microprocessor 12. Microprocessor 12 has at least one I/O communication pin 15 that here is shown connected to R1, with R1 typically having a value of 1K Ohms. Handheld instrument 10 is provided with a dual-signal, single-axis connector jack J1 that includes first 18 and second 20 conductive regions. It also has a single-signal, single axis connector jack J2. While shown here as being single-signal single-axis, J2 could also be a dual-signal single-axis jack. Typically, these jacks, J1 and J2, are both banana jacks, and would usually be of the same type.

A conductive path connected to the first conductive region 18 connects to R1, and through it is coupled to I/O communication pin 15 of microprocessor 12. A conductive path connected to the second conductive region 20 of the dual-signal, single-axis connector jack J1 is connected to ground. When jack J1 receives a conventional single-signal single-axis banana plug (not shown), that plug will make contact with both the first conductive region 18 and the second conductive region 20 of J1. The direct connection of second conductive region 20 with the instrument ground 16 makes J1 operable as a conventional ground connection. This ground is also coupled, through R1, to the I/O communication pin 15 of the microprocessor 14, where it is interpreted as "no data" or "measurement mode".

For use in the communications mode, J1 must receive a dual-signal, single-axis plug, such as P1. If these connectors are not of the radially symmetrical type, i.e., are bilaterally symmetrical instead, P1 will be constrained to have the proper relationship to J1 by some type of physical "keying" arrangement. Contacts 26 and 28 bring the first 22 and second 24 conductive areas of PI into electrical contact with their counterpart regions 18 and 20 of J1. Such a mating of P1 and J1 provides a connection between the ground 13 of the handheld instrument 10 microprocessor 12 and the ground 38,40 of the computer or other microprocessor based device 30. This mating connection also couples the I/O pin 15 of the handheld instrument 10 microprocessor 12, through R1, to the conductive area 22 of P1. The conductive area 22 of P1 is coupled to the input of receive amplifier 36 and the output of transmit amplifier 34, at the single I/O node 31 of the computer or other microprocessor based device 30. This coupling would be likely to include a cable (not shown) and a jack and plug (not shown) at the computer or other microprocessor based device 30 end of that cable.

The reader's attention is directed to the fact that there is some asymmetry in both FIG. 1 and FIG. 2. Namely, microprocessor 12 in the handheld instrument 10 is communicating on one pin 15 through R1 and J1, while microprocessor 32 in the computer, instrument or smart accessory device 30 is communicating through two pins, one for transmission Tx and another for receiving Rx. Node 31, on the low side of pull-up resistor R2, the output of transmission amplifier 34 and the input of receiver amplifier 36, is bidirectional while microprocessor 32 interacts through two unidirectional pins. It is not important to the overall idea of this invention what sort of hardware and software are used to create compatibility in communication over a single-signal and single ground return electrical interface. If a single set of amplifiers (external to the microprocessor) are deemed to be necessary, it may make more sense to put them on the side that has more power available and less restrictive weight and size constraints. If the computer or instrument on the right side of FIGS. 1 and 2 is assumed to be something larger than the handheld instrument on the left, then having these amplifiers 34 and 36 as shown makes sense, at least if it is assumed that they are needed at all.

For effective communication, both microprocessors 12 and 32 must be equipped with compatible communication software and appropriate supporting hardware as needed to enable communication over a single signal I/O path and a common ground. Examples of such communication systems are UART (Universal Asynchronous Receiver/Transmitter) based systems and "Peer-to-Peer" communication systems, the latter being a system used for local area networking of personal computers. UART based systems can be implemented by the use of stand-alone parts, or come built in to some microprocessors, or can be implemented completely in software and rely only on a single I/O pin 15 of the microprocessor.

While peer-to-peer systems, as their name implies, do not need to have identified in advance which device is to have more control over the communication process, UART-based systems generally require that one device act as "master" and that the other device act as "slave". The determination of the role a particular device is to play can be predetermined as part of the design, or be selected by local control on a case-by-case basis, or even resolved dynamically after a period of contention in some UART implementations.

Referring now to FIG. 2, as in FIG. 1, handheld instrument 10' contains a microprocessor 12 that has at least one I/O communication pin 15. As in FIG. 1, the handheld instrument 10 is provided with a dual-signal, single-axis connector jack J1 that includes first 18 and second 20 conductive regions. In this implementation, J1 has an active measurement function, i.e., a function other than providing a ground return. Such measurement functions might include AC or DC voltage, current, resistance, frequency, or temperature. In this implementation, S1 and S2 are provided to control whether J1 is connected to the measurement circuitry 14 or to the I/0 pin 15 of the microprocessor 12. Note that switches S1 and S2 would typically be implemented as transistors or some other type of switching device, rather than as the mechanical switches that they appear to be in this schematic.

When switches S1 and S2 are in the positions shown, the first conductive region 18 of J1 is coupled to pin 15 of microprocessor 12 through R1, and the second conductive region 20 of J1 is connected to instrument ground 16. With J1 connected in this manner, the handheld instrument 10' is in the communication mode and the functional result is the same as that shown in FIG. 1 and is appropriate to operation in the communication mode according to the present invention.

When switches S1 and S2 are in the alternate positions from those shown, both conductive regions 18 and 20 of J1 are connected to points in the measurement circuitry 14. Depending then on the type of plug inserted into J1, i.e., whether it is dual-signal or single-signal, either one or two electrical signals will be coupled to the measurement circuitry 14 for use in the measurement mode.

When switch S1 is in the alternate position from the one shown in FIG. 2, switch S2 is in the position shown in that figure, and a dual-signal single-axis plug is connected to J1, it is possible to apply a signal to be measured to the measurement circuitry 14 via switch S2 and at the same time apply a related ground signal to the ground 17 of the measurement circuity via the conductive region 20 of J1, switch S1, and ground connection 16. This arrangement provides another way that J1 can be used in the measurement mode of operation that is the alternative to the communication mode of the present invention. Thus, J1, with suitable inputs from P1, can serve at least three independent uses, depending on the positions of S1 and S2.

While a preferred embodiment of the present invention has been shown and described, it will be apparent to those skilled in the art that many changes and modifications may be made without departing from the invention in its broader aspects. For example, the microprocessor of the multimeter could be any one of a number of other computing means, or the split banana connectors could be any type of dual-signal, single axis connectors, such as old fashioned telephone switchboard connectors. Therefore, the claims that follow are intended to cover all such changes and modifications as are permitted by the patent laws of the respective countries in which this patent is granted.

What is claimed is:

1. A method for communication between a handheld multimeter containing a microprocessor or other internal computing means and a computer or other microprocessor-based device, the handheld multimeter having a measurement mode of operation and a communication mode of operation, the method comprising the steps of:

(a) providing the microprocessor or other internal computing means of the handheld multimeter with software and appropriate supporting hardware as needed to enable communication over a single signal I/O path and a common ground path;

(b) supplying a single signal I/O path and a common ground path to the microprocessor or other internal computing means or to the appropriate supporting hardware as needed;

(c) coupling the single signal I/O path to a first conductive region of a dual-signal single-axis jack of the handheld multimeter, said jack being used in support of at least one measurement function when the handheld multimeter is in the measurement mode of operation;

(d) coupling the common ground path to a second conductive region of the dual-signal single-axis jack of the handheld multimeter;

(e) also providing the computer or other microprocessor based device with software and appropriate supporting hardware as needed to enable communication over a single signal I/O conductor and a common ground conductor, said software and appropriate supporting hardware as needed being compatible with the software and appropriate supporting hardware as needed of the handheld multimeter;

(f) also supplying a single signal I/O conductor and a common ground conductor to the computer or other microprocessor based device or the appropriate supporting hardware of the computer or other microprocessor based device;

(g) coupling the single signal I/O conductor to a first conductive area of a dual-signal single-axis plug;

(h) coupling the common ground conductor to a second conductive area of the dual-signal single-axis plug;

(I) bringing the dual-signal single-axis plug of steps (g) and (h) into mating relationship with the dual-signal single-axis jack of steps (c) and (d) so that the first conductive region is in electrical contact with the first conductive area and the second conductive region is in contact with the second conductive area; and (j) initiating communications from the computer or other microprocessor based device to the microprocessor or other internal computing means of the handheld multimeter using the software and appropriate supporting hardware as needed of step (e); or (k) initiating communications from the microprocessor or other internal computing means of the handheld multimeter to the computer or other microprocessor based device using the software and appropriate supporting hardware as needed of step (a).

2. A method for communication according to claim 1 wherein the mutually compatible software and appropriate supporting hardware as needed of steps (a) and (e) comprise software suitable for supporting universal asynchronous receiver/transmitter (UART) communication.

3. A method for communication according to claim 1 wherein the mutually compatible software and appropriate supporting hardware as needed of steps (a) and (e) comprise software suitable for supporting peer-to-peer communication.

4. A method for communication according to claim 2 wherein the microprocessor or other internal computing means of the handheld multimeter is predetermined to operate as a "slave" during UART communication.

5. A method for communication according to claim 2 wherein the microprocessor or other internal computing means of the handheld multimeter is predetermined to operate as a "master" during UART communication.

6. A method for communication according to claim 2 wherein the microprocessor or other internal computing means of the handheld multimeter is selectively operable to act as either a "master"or a "slave" during UART communication.

7. A method for communication according to claim 1 wherein step (c) further comprises the step of:

(c.1) decoupling at least some measurement circuitry from said first conductive region of the dual-signal single-axis jack.

8. A method for communication according to claim 1 wherein the dual-signal single-axis jack and plug are of the "banana" type and the first and second conductive regions and areas are disposed lengthwise and prevented from making electrical contact by lateral insulative separators.

9. A method for communication according to claim 1 wherein the dual-signal single-axis jack and plug are of the "banana" type and the first and second conductive regions and areas are radially symmetrical and located at different distances along the single axis and are prevented from making electrical contact by a circular insulative separator.

10. A method for communication according to claim 1 wherein the dual-signal single-axis jack and plug are of the "old telephone" type and the first and second conductive regions and areas are circular and concentric and terminate at different distance along the single axis and are separated by a concentric insulative separator.

* * * * *